(12) United States Patent
Yamashita et al.

(10) Patent No.: US 11,723,184 B2
(45) Date of Patent: Aug. 8, 2023

(54) COMPONENT SUPPLY UNIT ARRANGEMENT DETERMINATION METHOD AND COMPONENT MOUNTING SYSTEM

(71) Applicant: FUJI CORPORATION, Chiryu (JP)

(72) Inventors: Yukihiro Yamashita, Toyohashi (JP); Yoshihiro Yasui, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 138 days.

(21) Appl. No.: 17/254,633

(22) PCT Filed: Jun. 26, 2018

(86) PCT No.: PCT/JP2018/024221
§ 371 (c)(1),
(2) Date: Dec. 21, 2020

(87) PCT Pub. No.: WO2020/003383
PCT Pub. Date: Jan. 2, 2020

(65) Prior Publication Data
US 2021/0153402 A1 May 20, 2021

(51) Int. Cl.
*H05K 13/08* (2006.01)
*H05K 13/04* (2006.01)
*H05K 13/02* (2006.01)

(52) U.S. Cl.
CPC ......... *H05K 13/086* (2018.08); *H05K 13/02* (2013.01); *H05K 13/0419* (2018.08); *H05K 13/085* (2018.08)

(58) Field of Classification Search
CPC .. H05K 13/02; H05K 13/0419; H05K 13/085; H05K 13/086
See application file for complete search history.

(56) References Cited

U.S. PATENT DOCUMENTS

2012/0285628 A1\* 11/2012 Katsumi ............ H05K 13/0419
156/767
2015/0223372 A1\* 8/2015 Kanai ..................... B65H 20/20
242/563

(Continued)

FOREIGN PATENT DOCUMENTS

EP  3 344 027 A1 \* 4/2018
JP  2000-59090 A  2/2000

(Continued)

OTHER PUBLICATIONS

International Search Report dated Sep. 25, 2018 in PCT/JP2018/024221 filed on Jun. 26, 2018, 1 page.

*Primary Examiner* — Peter Dungba Vo
*Assistant Examiner* — Jose K Abraham
(74) *Attorney, Agent, or Firm* — Oblon, McClelland, Maier & Neustadt, L.L.P.

(57) ABSTRACT

In a component supply unit arrangement determination method for a mounter, in which multiple component supply units are exchangeably arranged and which mounts a component on a board based on a job, as the component supply unit to be exchanged for the component supply unit to be newly arranged due to switching of multiple jobs whose execution order is determined, the component supply unit is selected such that a time interval from a job, in which the component supply unit is to be used last, to the switching is long, among the component supply units that are arranged before the switching and are not planned to be used in a job after the switching. In addition, an arrangement position of the selected component supply unit is determined as an arrangement position of the component supply unit to be newly arranged.

5 Claims, 7 Drawing Sheets (56) References Cited

U.S. PATENT DOCUMENTS

2019/0373782 A1* 12/2019 Matsushita .......... H05K 13/086
2020/0401974 A1* 12/2020 Matsushita ............ H05K 13/02

FOREIGN PATENT DOCUMENTS

| JP | 4728278 B | * | 7/2011 | |
|----|-----------|---|--------|---|
| JP | 5084557 B | * | 11/2012 | |
| WO | WO-2009062524 A1 | * | 5/2009 | ......... H05K 13/0417 |
| WO | 2014010084 | * | 1/2014 | |
| WO | WO 2014/068712 A1 | | 5/2014 | |
| WO | WO-2014068712 A1 | * | 5/2014 | ......... H05K 13/0857 |
| WO | WO-2015019412 A1 | * | 2/2015 | ........... H05K 13/086 |
| WO | WO-2019187007 A1 | * | 10/2019 | |

* cited by examiner

| SLOT NUMBER | COMPONENT TYPE | LAST JOB Ne |
|---|---|---|
| 01 | A** | JOB2 |
| 02 | B** | JOB3 |
| 03 | C** | JOB1 |
| 04 | D** | JOB5 |
| ⋮ | ⋮ | ⋮ |

Fig. 9

COMPONENT SUPPLY UNIT ARRANGEMENT DETERMINATION METHOD AND COMPONENT MOUNTING SYSTEM

TECHNICAL FIELD

The present description discloses a component supply unit arrangement determination method and a component mounting system.

BACKGROUND ART

Conventionally, a component mounting system that includes multiple mounters, on which multiple feeders for component supply (component supply units) are detachably mounted, and picks up a component from the component supply unit based on a job to mount the component on a board while conveying the board with each mounter in turn has been proposed (for example, see Patent Literature 1). In the system, based on the content of the multiple jobs whose execution order is determined, a component supply unit that needs to be exchanged at the time of a changeover is learned, and an instruction to prepare for an exchange is given at a timing prior to the changeover, thereby making an operator prepare for the exchange.

PATENT LITERATURE

Patent Literature 1: JP-A-2000-59090

BRIEF SUMMARY

Technical Problem

Through the exchange preparation described above, it is possible to efficiently exchange the component supply units at the time of the changeover. However, in such a case where the number of component supply units to be exchanged is large, even when the exchange is prepared, it is likely to take a long time for stopping the mounter at the time of the changeover and exchanging the component supply units, thereby leading to a decrease in the production efficiency of the component mounting system. In order to prevent such a case, it is required to appropriately suppress an increase in the exchange time of the component supply units at the time of the changeover.

A main object of the present disclosure is to appropriately suppress an increase in the exchange time of the component supply units at the time of a changeover and to improve production efficiency, by securing sufficient time for exchanging the component supply units.

Solution to Problem

The present disclosure adopts the following means in order to achieve the main object described above.

According to an aspect of the present disclosure, there is provided a component supply unit arrangement determination method for a mounter, in which multiple component supply units are exchangeably arranged and which mounts a component on a board based on a job, the component supply unit arrangement determination method comprising: (a) a step of selecting the component supply unit, being as the component supply unit to be exchanged for the component supply unit to be newly arranged with respect to switching of multiple jobs whose execution order is determined, in a way such that a time interval from a job, in which the component supply unit is to be used last, to the switching becomes long, the component supply unit being selected among the component supply units that are arranged before the switching and are not planned to be used in a job after the switching; and (b) a step of determining an arrangement position of the component supply unit selected in the step (a) as an arrangement position of the component supply unit to be newly arranged.

In the component supply unit arrangement determination method of the present disclosure, as the component supply unit to be exchanged for the component supply unit to be newly arranged due to switching of multiple jobs whose execution order is determined, the component supply unit is selected such that the time interval from the job, in which the component supply unit is to be used last, to the switching is long. Then, the arrangement position of the selected component supply unit is determined as the arrangement position of the component supply unit to be newly arranged. Accordingly, the exchange for the component supply unit to be newly arranged need only be performed for a relatively long time from the job, in which the arranged component supply unit is to be used last, to the switching. That is, it is possible to exchange the component supply units from an early stage, and sufficient time for exchanging the component supply units can be secured. Therefore, an increase in the exchange time of the component supply units at the time of the changeover can be appropriately suppressed, and production efficiency can be improved.

DESCRIPTION OF EMBODIMENTS

Next, an embodiment of the present disclosure will be described with reference to the drawings.

Figure 1:
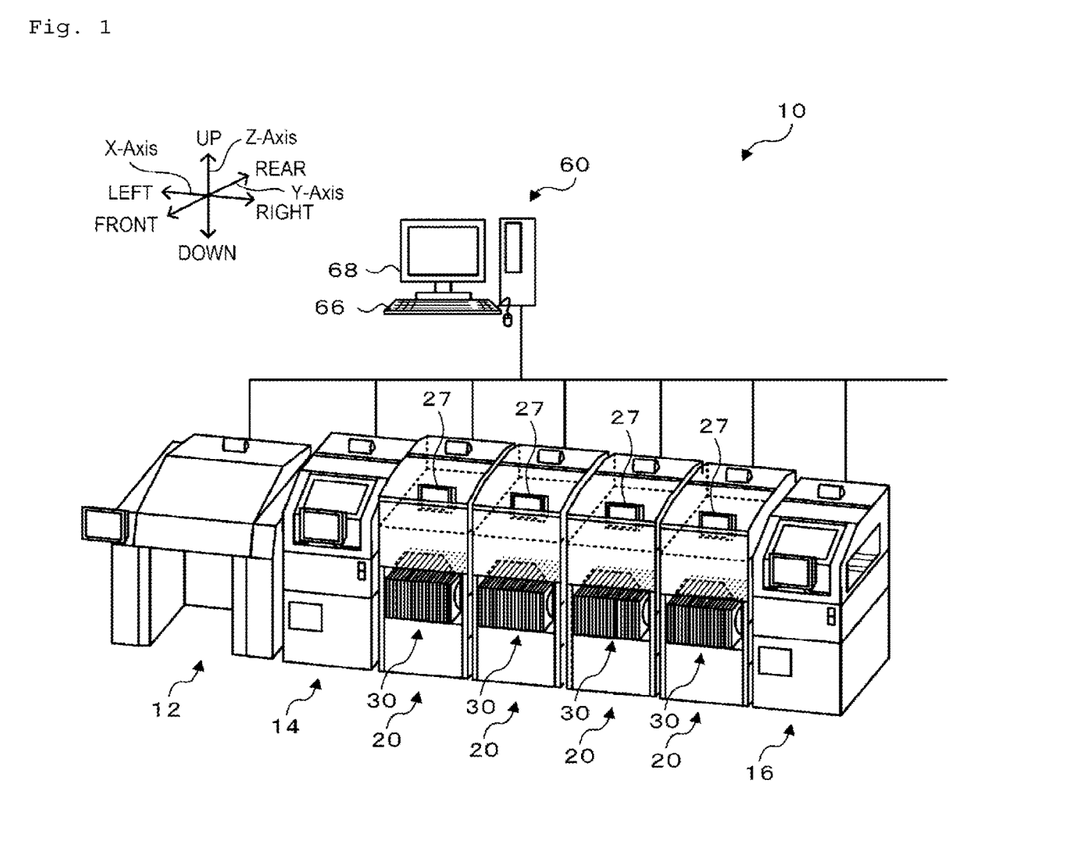
FIG. 1 is a configuration view showing a schematic configuration of component mounting system 10.
Figure 2:
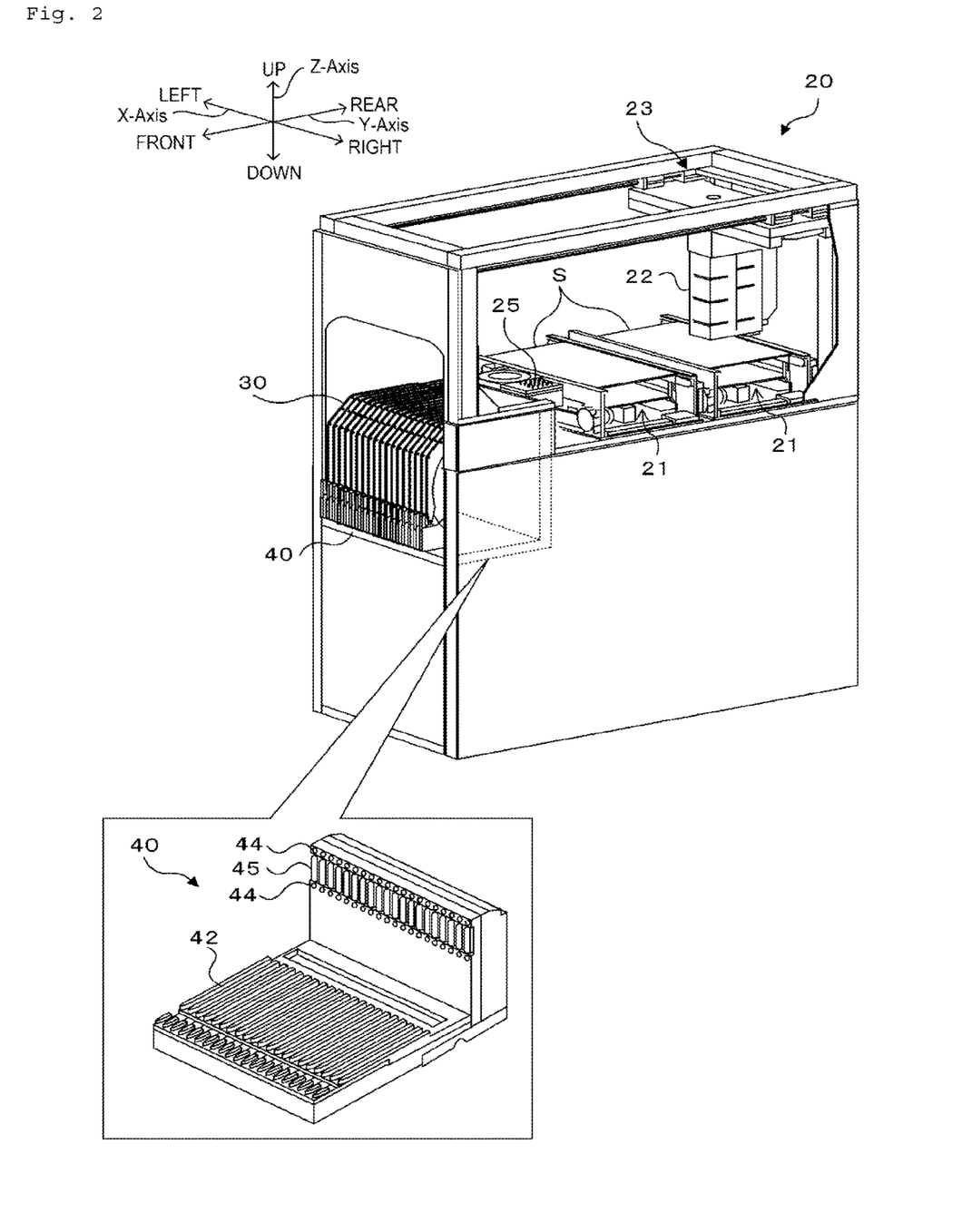
FIG. 2 is a configuration view showing a schematic configuration of mounter 20.
Figure 3:
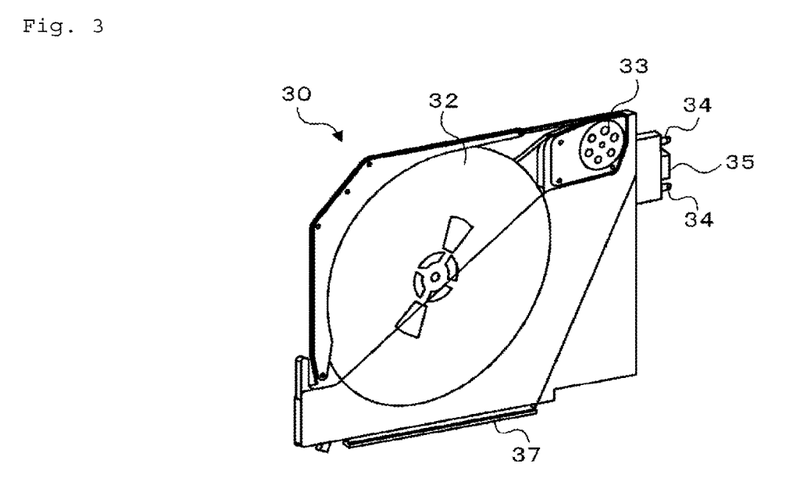
FIG. 3 is a configuration view showing a schematic configuration of feeder 30.
Figure 4:
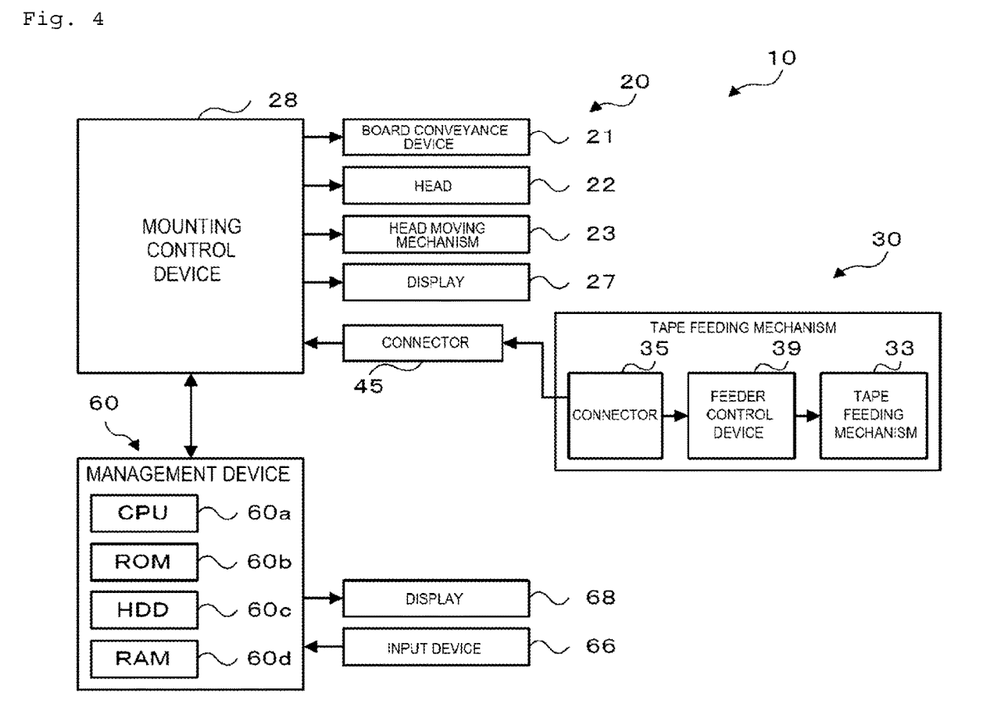
FIG. 4 is a configuration diagram related to control of component mounting system 10.

FIG. 1 is a configuration view showing a schematic configuration of component mounting system 10 of the present embodiment; FIG. 2 is a configuration view showing a schematic configuration of mounter 20; FIG. 3 is a configuration view showing a schematic configuration of feeder 30; FIG. 4 is a configuration diagram related to the control of component mounting system 10. A right-left direction of FIGS. 1 and 2 is an X-direction, a front-rear direction is a Y-direction, and an up-down direction is a Z-direction.

As shown in FIG. 1, component mounting system 10 includes printer 12, printing inspector 14, multiple mounters 20, mounting inspector 16, and management device 60. Printer 12 performs printing on board S (see FIG. 2) by pushing solder into a pattern hole formed in a screen mask. Printing inspector 14 inspects the state of the solder printed by printer 12. Mounters 20 are arranged along a board S conveyance direction (X-axis direction) to mount a component on board S. Mounting inspector 16 inspects the mounting state of the component mounted on board S by mounters 20. Management device 60 manages entire component mounting system 10. Component mounting system 10 is capable of performing a component mounting process on multiple types of boards S. Examples of multiple types of boards S include boards S having board sizes different from each other and boards S on which types of components different from each other are mounted.

As shown in FIG. 2, mounter 20 includes board conveyance device 21 that conveys board S in the X-direction, head 22 that has a suction nozzle for picking up a component supplied by feeder 30, head moving mechanism 23 that moves head 22 in the X- and Y-directions, nozzle station 25 that accommodates multiple types of suction nozzles, and display 27 (see FIG. 1), such as an LCD. Although not shown, one or more nozzle holders that exchangeably hold suction nozzles are arranged in head 22. In mounter 20, an exchange for any of multiple types of heads 22 having different numbers of nozzle holders arranged from each other is possible, and an exchange for a head suitable for the type of component to be mounted, among multiple types of heads 22, is possible. In addition, since nozzle station 25 accommodates multiple types of nozzles, an exchange for a suction nozzle suitable for the type of component to be picked up is possible for head 22. In addition, mounter 20 includes mounting control device 28 (see FIG. 5) configured by well-known CPU, ROM, and RAM for controlling the entire device. Mounting control device 28 outputs control signals to board conveyance device 21, head 22, head moving mechanism 23, and display 27. In addition, feeder base 40, which is formed in an L-shape in side view and to which multiple feeders 30 are attached, is provided at the front of mounter 20; multiple feeders 30 are detachably set by an operator.

Feeder 30, as shown in FIG. 3, is configured as a tape feeder that feeds tape for accommodating components at a predetermined pitch. Feeder 30 includes tape reel 32 around which tape is wound, tape feeding mechanism 33 that feeds the tape from tape reel 32, connector 35 that has two positioning pins 34, rail member 37 provided at a lower end, and feeder control device 39 (see FIG. 5). As shown in FIG. 2, feeder base 40 includes multiple slots 42, which are arrayed in the X-direction at intervals and allow rail member 37 of feeder 30 to be inserted, two positioning holes 44, and connector 45 provided between two positioning holes 44. When rail member 37 of feeder 30 is inserted into slot 42 of feeder base 40 and two positioning pins 34 of feeder 30 are inserted into two positioning holes 44, connector 35 and connector 45 are connected to each other. Feeder control device 39 is configured by well-known CPU, ROM, and RAM, and outputs a drive signal to tape feeding mechanism 33. In addition, feeder control device 39 can communicate with mounting control device 28, which is an attachment destination of feeder 30, via connection of connectors 35 and 45.

As shown in FIG. 4, management device 60 is configured by well-known CPU 60a, ROM 60b, HDD 60c, and RAM 60d, and includes input device 66 such as a keyboard and a mouse and display 68 such as an LCD. Management device 60 stores production job information in HDD 60c. It is determined that the production job information includes, for each mounter 20, information on a type of component to be mounted on board S, information on the mounting order of each component, information on the mounting position of each component, information on feeder 30 supplying each component, information on head 22 used in mounting a component, information on a suction nozzle picking up a component, and information on the number of boards S to be produced. In addition, management device 60 stores feeder arrangement information in HDD 60c. The feeder arrangement information includes various types of information including the positions of slots 42 for feeders 30 to be arranged in each mounter 20 for each job and a component type of each feeder 30. Management device 60 is connected to mounting control device 28 so as to be able to communicate therewith; the management device receives information related to the mounting status of mounter 20 from mounting control device 28, or transmits production job information or feeder arrangement information to mounting control device 28. Mounting control device 28 can cause display 27 to display necessary information based on the information received from management device 60. In addition, management device 60 is connected to printer 12, printing inspector 14, and each control device (not shown) of mounting inspector 16 so as to be able to communicate therewith; the management device receives information related to an operation status from each device, or transmits an operation instruction.

Figure 5:
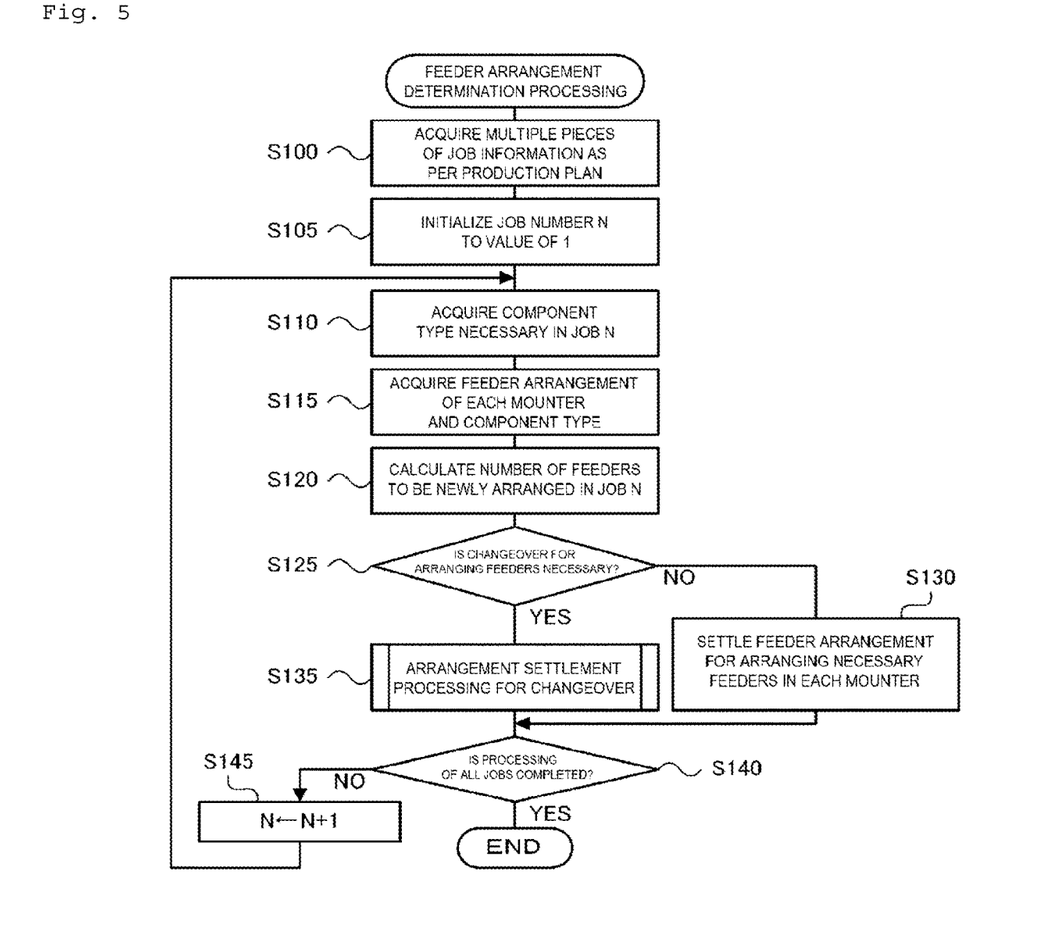
FIG. 5 is a flowchart showing an example of feeder arrangement determination processing.

Processing for determining the feeder arrangement in component mounting system 10 configured as described above will be described. FIG. 5 is a flowchart showing an example of feeder arrangement determination processing. This processing is executed by CPU 60a of management device 60, for example, when an instruction to determine feeder arrangement is received from the operator. Through this processing, the arrangement of feeders 30 to be arranged in each mounter 20 in order to execute a series of multiple jobs is subsequently determined and stored as feeder arrangement information in HDD 60c. The execution order of the multiple jobs is determined. In addition, without being limited to determining the arrangement of feeders 30 in multiple mounters 20, the arrangement of feeders 30 in one mounter 20 may be determined. In the feeder arrangement determination processing, CPU 60a acquires multiple pieces of job information as per a production plan (S100), and initializes job number N indicating the order of execution order of a job to the value of 1 (S105). In the following description, a job with job number N will be referred to as job N. Next, CPU 60a acquires a component type necessary in processing job N (herein, job 1) from the job information (S110). In addition, CPU 60a acquires the current arrangement of feeders 30 of each mounter 20 and a component type of each feeder 30 (S115), and calculates the number of feeders 30 to be newly arranged in job N (S120). In S120, CPU 60a compares the necessary component type acquired in S110 with the component type of feeders 30 acquired in S115, and selects feeders 30 of the component type, which are to be newly arranged, to calculate the number of feeders 30.

Next, CPU 60a determines whether a changeover for newly arranging feeders 30 is necessary when switching to job N (S125). Herein, CPU 60a determines whether it is necessary to exchange feeders 30, which are already arranged before switching to job N and are not planned to be used in job N, for feeders 30 necessary in job N. CPU 60a need only determine whether the changeover is necessary based on whether the number of feeders 30 to be newly arranged exceeds the total number of currently empty slots in each mounter 20. In addition, depending on a component type, there are restrictions on the type of head 22 and the type of the suction nozzle, and mounter 20 available to the mounting of the component type is limited in some cases. In this case, CPU 60a may determine whether the changeover is necessary based on whether there are a necessary number of empty slots 42 in available mounter 20.

When it is determined that the changeover is not necessary in S125, CPU 60a selects empty slot positions in each mounter 20 as arrangement positions so as to set up the feeder arrangement of necessary feeders 30 (S130), and determines whether the processing of all the jobs acquired in S100 is completed (S140). In S130, for example, CPU 60a allocates feeders to each mounter 20 in a distributed manner such that the number of feeders 30 arranged is not significantly biased, and selects empty slots in each mounter 20 such that feeder arrangement is determined. Feeder arrangement is set up by allocating feeders 30 of a component type having the restrictions described above to mounter 20 corresponding to the restrictions. In addition, when it is determined that the changeover is necessary in S125, CPU 60a executes arrangement settlement processing for the changeover (S135), and determines whether the processing of all the jobs, which are the multiple jobs acquired in S100, is completed (S140). When it is determined that the processing of all the jobs is not completed in S140, CPU 60a increases job number N by the value of 1 (S145), returns to S110, and terminates the feeder arrangement determination processing when it is determined that the processing of all the jobs is completed.

Figure 6:
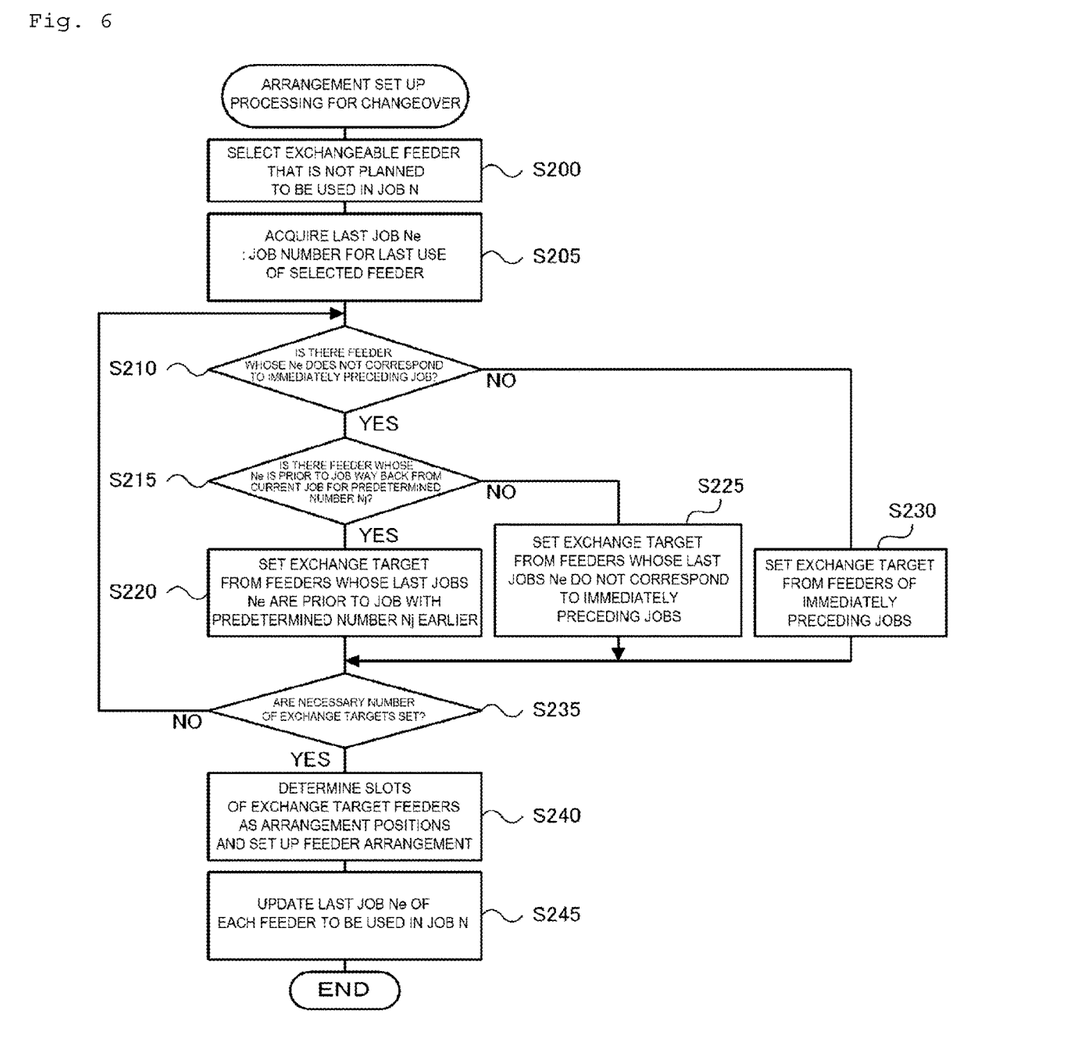
FIG. 6 is a flowchart showing an example of arrangement settlement processing for a changeover.
Figure 7:
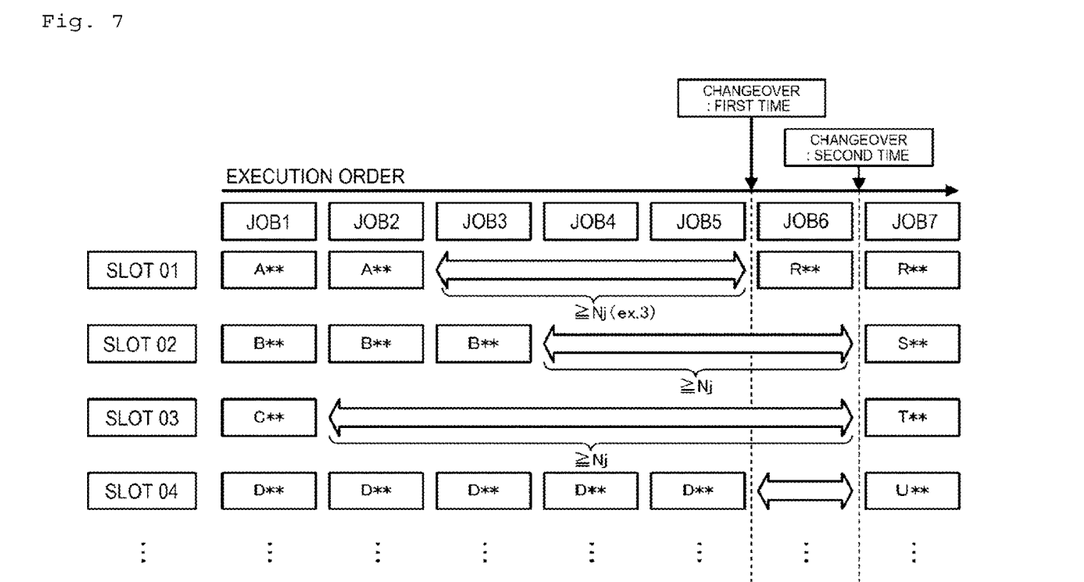
FIG. 7 is an explanatory diagram showing an example of execution order of jobs and feeder exchanges.
Figure 8:
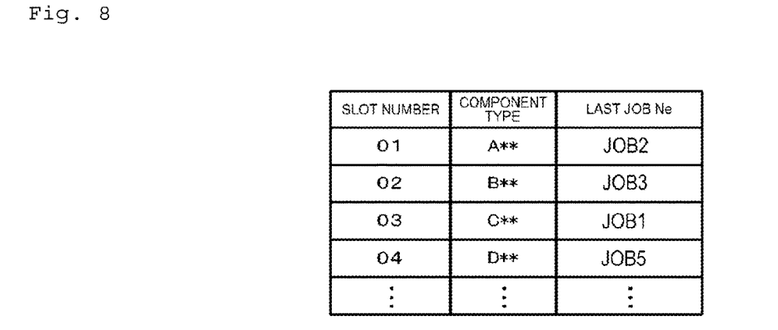
FIG. 8 is an explanatory diagram showing an example of a slot number, a component type, and last job Ne.

Herein, the arrangement settlement processing for the changeover in S135 is performed based on a flowchart shown in FIG. 6. In addition, FIG. 7 is an explanatory diagram showing an example of execution order of jobs and feeder exchanges; FIG. 8 is an explanatory diagram showing an example of a slot number, a component type, and last job Ne. FIG. 7 shows component types of feeders 30 that are set in slots 42 having slot numbers 01, 02, 03, and 04 and are used in each job in a case of executing a series of jobs 1 to 7 under the execution order. In feeder base 40, there are approximately several tens of slots 42, but only some are shown in FIG. 7. In addition, in the following description, slot 42 having slot number 01 will be referred to as slot 01, and the same applies to other slots 42.

In the example of FIG. 7, in job 1, feeders 30 of component types A, B, C, and D in slots 01 to 04 are used respectively; in job 2, feeders 30 of component types A, B, and D in slots 01, 02, and 04 are used respectively. In addition, in job 3, feeders 30 of component types B and D in slots 02 and 04 are used respectively; in jobs 4 and 5, feeder 30 of component type D in slot 04 is used. Feeder 30 of component type A in slot 01 is not planned to be used after job 2; thus, last job Ne, being the job for the last use of the feeder, is job 2 (see FIG. 8). Similarly, last job Ne of feeder 30 of component type B in slot 02 is job 3; last job Ne of feeder 30 of component type C in slot 03 is job 1; last job Ne of feeder 30 of component type D in slot 04 is job 5. In addition, in FIG. 7, CPU 60a determines that the changeover is not necessary in S125 of FIG. 5 when determining the arrangement of feeders 30 in jobs 1 to 5, and determines that the changeover is necessary when determining the arrangement of feeders 30 in each of jobs 6 and 7. For this reason, CPU 60a executes the arrangement settlement processing for the changeover of FIG. 6 in the first changeover between job 5 and job 6 and the second changeover between job 6 and job 7.

In the arrangement settlement processing for the changeover of FIG. 6, CPU 60a first selects exchangeable feeder 30 that is not planned to be used in job N among arranged feeders 30 whose arrangement in each mounter 20 is determined (S200). CPU 20a need only, for example, perform selection of S200 with respect to all feeders 30 arranged in each mounter 20. In the first changeover of FIG. 7, feeder 30 in each of slots 01 to 04 is selected as exchangeable feeder 30 that is not planned to be used in job N (herein, job 6). Next, CPU 60a acquires last job Ne of feeder 30 that is selected as the exchangeable feeder (S205). As described above, in the examples of FIGS. 7 and 8, jobs 2, 3, 1, and 5 are acquired as last jobs Ne of the feeders in slots 01 to 04 respectively. CPU 60a registers last jobs Ne, in association with the slot numbers (see FIG. 8) through processing to be described later, in a storage section, such as HDD 60c and RAM 60d, and acquires last jobs Ne from HDD 60c and RAM 60d in S205.

Then, CPU 60a determines whether there is feeder 30 whose last job Ne acquired in S205 does not correspond to a job immediately preceding the current changeover (S210). Since a job immediately preceding current job N is job (N−1), CPU 60a determines whether there is feeder 30 whose last job Ne does not correspond to job (N−1) in S215. In the first changeover of FIG. 7, it is determined that last jobs Ne of feeders 30 in slots 01 to 03 do not correspond to the immediately preceding job, and it is determined that last job Ne of feeder 30 in slot 04 corresponds to the immediately preceding job. In the second changeover of FIG. 7, it is determined that last job Ne of feeder 30 in slot 04 does not correspond to the immediately preceding job.

When it is determined that there is feeder 30 whose last job Ne does not correspond to the immediately preceding job in S210, CPU 60a determines whether there is feeder 30 whose last job Ne is predetermined number Nj earlier than current job N (S215). In this processing, it is determined whether there is feeder 30 for which predetermined number Nj or more of jobs are executed between last job Ne and current job N of feeder 30, among feeders 30 whose last jobs Ne do not correspond to the immediately preceding jobs. When it is determined that there are feeders 30 whose last jobs Ne are predetermined number Nj earlier, CPU 60a selects feeder 30 to be exchanged from the feeders (S220). In this case, feeder 30 to be exchanged is set with a time interval for which at least predetermined number Nj of jobs are executed. In the first changeover of FIG. 7, the number of jobs from last job Ne to current job 6 of respective feeders 30 in slots 01 to 04 is the value of 3, 2, 4, and 0, respectively. For this reason, for example, in a case where predetermined number Nj is set to the value of 3 (three jobs), CPU 60a determines that there are feeders 30 in slots 01 and 03 in S215. Therefore, for example, feeder 30 in slot 01 is selected as an exchange target for feeder 30 of component type R to be used in job 6. It is evident that feeder 30 in slot 03 may be selected. In the case of the second changeover of FIG. 7, feeder 30 in slot 02 can also be selected in S215 and S220. In the example of FIG. 7, feeders 30 in slots 02 and 03 are selected as exchange targets for feeders 30 of component types S and T** to be used in job 7 in the second changeover.

In addition, when it is determined that there is no feeder 30 whose last job Ne is predetermined number Nj earlier in S220, CPU 60a sets an exchange target from feeders 30 whose last jobs Ne do not correspond to the immediately preceding jobs (S225). For example, feeder 30 in slot 04 is selected as an exchange target for feeder 30 of component type U to be used in job 7 in the second changeover of FIG. 7. As described above, when there is feeder 30 whose last job Ne is predetermined number Nj earlier, CPU 60a preferentially sets that feeder 30 as an exchange target; when there is no feeder 30 whose last job Ne is predetermined number Nj earlier, CPU 60a preferentially sets feeder 30 whose last job Ne does not correspond to the immediately preceding job as an exchange target. In the example of FIG. 7, the operator need only perform an exchange for feeder 30 of component type R in job 6 during the execution of jobs 3 to 5; the operator need only perform an exchange for feeder 30 of component type S in job 7 during the execution of jobs 4 to 6; the operator need only perform an exchange for feeder 30 of component type T in job 7 during the execution of jobs 2 to 6. That is, since the operator need only perform an exchange of feeders 30 in advance during the execution of multiple jobs, sufficient time for exchanging feeders 30 can be secured. In addition, the operator need only perform an exchange for feeder 30 of component type U** in job 7 while job 6 is being executed. That is, the execution time of at least one job is secured as the exchange time of feeders 30.

In addition, when it is determined that there is no feeder 30 whose last job Ne does not correspond to the immediately preceding job in S215, CPU 60a sets an exchange target from feeders 30 whose last jobs Ne correspond to the immediately preceding jobs (S230). In this case, an exchange of feeders 30 is performed at the time of the changeover with the switching of jobs. However, since feeder 30 whose last job Ne is predetermined number Nj earlier or feeder 30 whose last job Ne does not correspond to the immediately preceding job is preferentially set as an exchange target, it is possible to suppress an increase in the number of feeders 30, whose last jobs Ne correspond to the immediately preceding jobs, being set as an exchange target. For this reason, even when an exchange of feeders 30 is performed at the time of the changeover with the switching of jobs, it is possible to efficiently perform the changeover by shortening time required for exchanging feeders 30. When an exchange target is set in this manner, CPU 60a determines whether a necessary number of feeders 30 that need to be arranged at the time of the changeover are set as exchange targets (S235); when it is determined that the necessary number of feeders 30 are not set as exchange targets, CPU 60a repeats the processing of S210 to S230. On the other hand, when it is determined that the necessary number of feeders 30 are set as exchange targets, CPU 60a determines slots 42 for feeders 30, which are the exchange targets set in S220, S225, and S230, as arrangement positions so as to set up the feeder arrangement in job N (S240). Next, CPU 60a updates last job Ne of each feeder 30 to be used in job N to current job N (S245), and terminates the arrangement settlement processing for the changeover. In S245, as only last jobs Ne of feeders 30 to be used in job N are updated and last jobs Ne of feeders 30 not to be used in job N are not updated, thereby job N, being the job for the last use of the feeder, is registered as last job Ne.

Herein, a correspondence relationship between the configuration elements of the present embodiment and the configuration elements of the present disclosure will be clarified. Feeder 30 of the present embodiment corresponds to a component supply unit, mounter 20 corresponds to a mounter, S200 to S235 of the arrangement settlement processing for the changeover of FIG. 6 correspond to step (a), and S240 of the processing corresponds to step (b). In addition, CPU 60a of management device 60 that executes S200 to S235 of the arrangement settlement processing for the changeover corresponds to a selection section, and CPU 60a that executes S240 of the processing corresponds to a determination section.

Component mounting system 10 described above selects a feeder having a long time interval from last job Ne to current job N as arranged feeder 30 to be exchanged for feeder 30 to be arranged due to switching of multiple jobs whose execution order is determined. Accordingly, sufficient time for an exchange for feeder 30 to be newly arranged can be secured, and the exchange can be performed in advance before the switching of jobs. Therefore, an increase in the exchange time of feeder 30 at the time of a changeover can be appropriately suppressed, and production efficiency can be improved.

In addition, since feeder 30 for which predetermined number Nj or more of jobs are executed until switching from last job Ne to current job N is preferentially selected, sufficient time for exchanging feeders 30 can be more reliably secured. In addition, since an exchange target is preferentially selected except from feeders 30 whose last jobs Ne correspond to the immediately preceding jobs, an exchange for feeder 30 to be newly arranged need only be performed at least during the execution of the immediately preceding job.

As a matter of course, the present disclosure is not limited to the embodiment described above, and may be performed in various aspects insofar as the aspects belong to the technical scope of the present disclosure.

Figure 9:
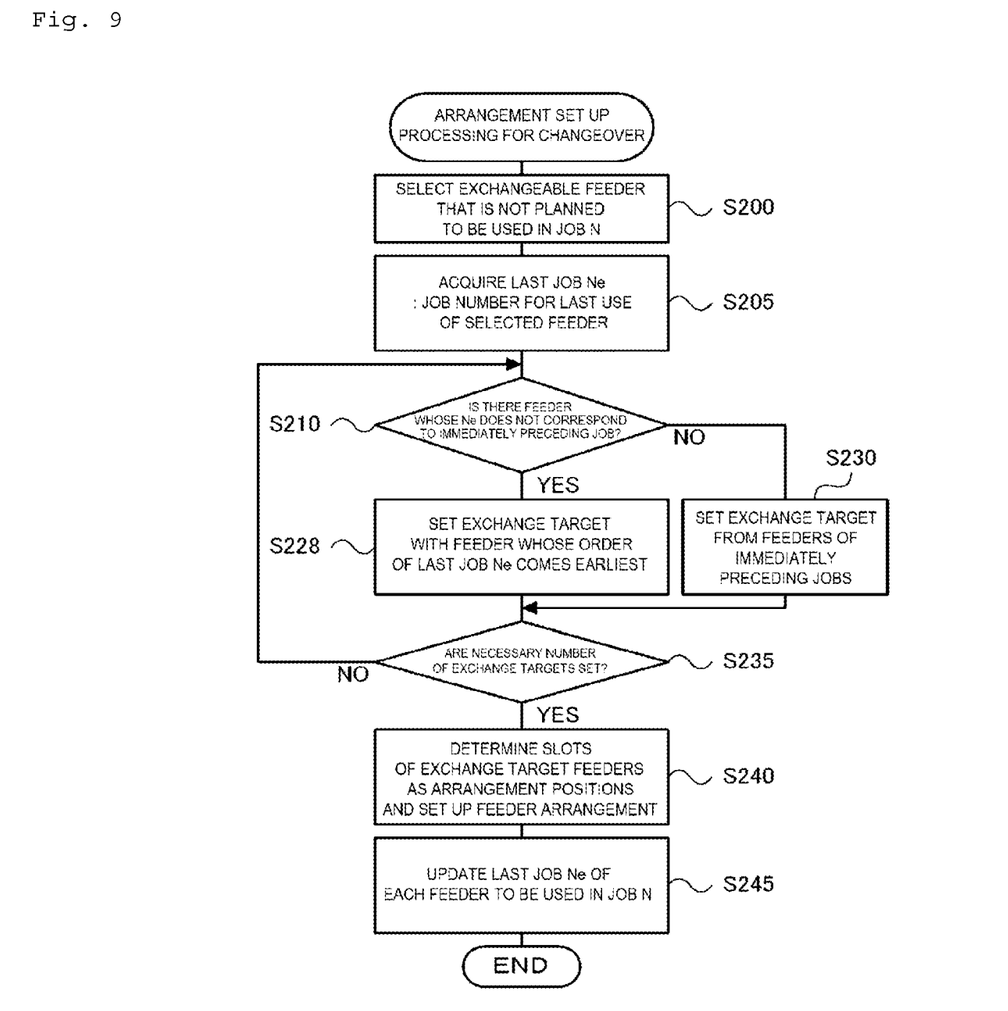
FIG. 9 is a flowchart showing arrangement settlement processing for a changeover of a modification example.

For example, feeder 30 whose last job Ne is predetermined number Nj earlier is preferentially selected, among feeders 30 whose last jobs Ne do not correspond to the immediately preceding jobs, in the embodiment described above; however, the configuration is not limited to this. Herein, FIG. 9 is a flowchart showing arrangement settlement processing for a changeover of a modification example. In FIG. 9, the same step number is assigned to the same processing as in FIG. 6. In addition, in FIG. 9, the same processing as in FIG. 6 is performed except that the processing of S228 is performed instead of the processing of S215 to S225 in FIG. 6. That is, when it is determined that there is feeder 30 whose last job Ne does not correspond to the immediately preceding job in S210, CPU 60a preferentially sets, as an exchange target, feeder 30 whose last job Ne is earliest (smallest value), among feeders 30 whose last jobs Ne does not correspond to the immediately preceding jobs (S228). For this reason, for example, in the first changeover of FIG. 7, respective feeders 30 in slots 03, 01, and 02 are set in turn as exchange targets. For this reason, even in this modification example, sufficient time for an exchange for feeder 30 to be newly arranged can be secured, and the exchange can be performed early.

In addition, among feeders 30 whose last jobs Ne are predetermined number Nj earlier, feeder 30 whose last job Ne is earliest may be preferentially selected as an exchange target. Alternatively, without being limited to preferentially selecting a feeder whose last job Ne is predetermined number Nj earlier or a feeder whose last job Ne is earliest, feeder 30 whose last job Ne does not correspond to the immediately preceding job may be preferentially selected as an exchange target. In addition, instead of determining whether last job Ne corresponds to the immediately preceding job, feeder 30 whose last job Ne is predetermined number Nj earlier may be selected as an exchange target, or feeder 30 whose last job Ne is earliest may be selected as an exchange target. In addition, feeder 30, which is an exchange target, need only be selected such that a time interval from last job Ne to switching is long; without being limited to selecting feeder 30, which is an exchange target, based on the number of jobs and job order, feeder 30, which is an exchange target, may be selected based on time required for executing a job.

Although multiple feeders 30 are detachable by the operator from feeder base 40 of mounter 20 in the embodiment described above, without being limited thereto, multiple feeders 30 may be detachable by an exchanging robot. Even in this case, the same effect as that of a mounting mode can be obtained by securing sufficient time for exchanging feeders 30.

In the component supply unit arrangement determination method of the present disclosure, in the step (a), the component supply unit, which is other than the component supply unit, the job of which for the last use of the component supply unit corresponding to the job immediately preceding the switching, may be preferentially selected. In this manner, since an exchange for a component supply unit to be newly arranged need only be performed while at least the immediately preceding job is being executed, sufficient time for exchanging the component supply units can be secured.

In the component supply unit arrangement determination method of the present disclosure, in the step (a), the component supply unit, for which a predetermined number or more of jobs are executed during a period from the job for the last use of the component supply unit to the switching, may be preferentially selected. In this manner, since the exchange of the component supply units need only be performed while a predetermined number of jobs are being executed, sufficient time for exchanging the component supply units can be more reliably secured.

In the component supply unit arrangement determination method of the present disclosure, in the step (a), the component supply unit whose job in which the component supply unit is to be used last, is earliest may be preferentially selected. In this manner, since it is possible to perform an exchange of the component supply units from an early stage, sufficient time for exchanging the component supply units can be more reliably secured.

The component mounting system of the present disclosure is a component mounting system comprising: a mounter in which multiple component supply units are exchangeably arranged and which mounts a component on a board based on a job; a selection section configured to select the component supply unit, as the component supply unit to be exchanged for the component supply unit to be newly arranged due to switching of multiple jobs whose execution order is determined, in a way such that a time interval from a job, in which the component supply unit is to be used last, to the switching becomes long, the component supply unit being selected among the component supply units that are arranged before the switching and are not planned to be used in a job after the switching; and a determination section configured to determine an arrangement position of the component supply unit selected by the selection section as an arrangement position of the component supply unit to be newly arranged.

In the component mounting system of the present disclosure, a component supply unit is selected as a component supply unit to be exchanged for a component supply unit to be newly arranged due to switching of multiple jobs whose execution order is determined, such that a time interval from a job, in which the component supply unit is to be used last, to the switching is long. Then, the arrangement position of the selected component supply unit is determined as the arrangement position of the component supply unit to be newly arranged. Accordingly, as in the component supply unit arrangement determination method described above, it is possible to exchange the component supply units from an early stage, and sufficient time for exchanging the component supply units can be secured. Therefore, an increase in the exchange time of the component supply units at the time of the changeover can be appropriately suppressed, and production efficiency can be improved. In the component mounting system, various aspects of the arrangement determination method described above may be adopted, or a configuration for performing each step of the arrangement determination method may be added.

INDUSTRIAL APPLICABILITY

The present disclosure is applicable to a manufacturing industry of the component mounting system.

REFERENCE SIGNS LIST 10 component mounting system, 12 printer, 14 printing inspector, 20 mounter, 21 board conveyance device, 22 head, 23 head moving mechanism, 25 nozzle station, 27 display, 28 mounting control device, 30 feeder, 32 tape reel, 33 tape feeding mechanism, 34 positioning pin, 35 connector, 37 rail member, 39 feeder control device, 40 feeder base, 42 slot, 44 positioning hole, 45 connector, 60 management device, 60a CPU, 60b ROM, 60c HDD, 60d RAM, 66 input device, 68 display, S board.

The invention claimed is:

1. A component supply unit arrangement determination method for a selected mounter from a plurality of mounters, in which multiple component supply units are exchangeably arranged for each mounter, which mounts a component on a board based on a job, the component supply unit arrangement determination method comprising:
   determining whether a changeover for arranging the multiple component supply units is necessary for one job among multiple jobs in a determined job execution order;
   when it is determined that the changeover is necessary for the one job, selecting the component supply unit to be exchanged for a new component supply unit during switching between the multiple jobs such that a time interval from a previous job, in which the component supply unit to be exchanged is last used, to the switching is longer than a predetermined time interval, wherein the predetermined time interval corresponds to an exchange time determined before executing the one job, a component supply unit to be exchanged with a new component supply unit being selected among the component supply units that are arranged before the switching and are not planned to be used in the one job after the switching;
   determining an arrangement position of the newly selected component supply unit as an arrangement position of the component supply unit to be newly arranged in the one job,
   prior to performing the one job, arranging the newly selected component supply unit based on the determined arrangement position for the one job; and
   executing the one job after switching the newly selected supply unit of the mounter.

2. The component supply unit arrangement determination method according to claim 1, wherein during selecting the new component supply unit, a component supply unit is selected as the new component supply unit which is last used in a job immediately before the switching.

3. The component supply unit arrangement determination method according to claim 1, wherein during selecting the new component supply unit, a component supply unit is selected as the new component supply unit which is last used in a prior job, which executed mounting jobs that is greater than or equal to predetermined number of jobs from the switching.

4. The component supply unit arrangement determination method according to claim 1, wherein during selecting the new component supply unit, a component supply unit selected as the new component supply unit which is last used earliest.

5. A component mounting system comprising:
a plurality of mounters;
the plurality of mounter in which multiple component supply units are exchangeably arranged for each mounter, which mounts a component on a board based on a job;
a controller including a mounting control device connected to a board conveyance device and head moving mechanism, configured to:
   determine whether a changeover for arranging the multiple component supply units is necessary for one job among multiple jobs in a determined mounting execution order;
   when it is determined that the changeover is necessary for the one job, select the component supply unit, to be exchanged for a new component supply unit during switching between the multiple jobs such that a time interval from a previous job, in which the component supply unit to be exchanged is last used, to the switching is longer than a predetermined time interval, wherein the predetermined time interval corresponds to an exchange time determined before executing the one job, a component supply unit being selected to be exchanged with a new component supply unit among the component supply units that are arranged before the switching and are not planned to be used in the one job after the switching; and
   determine an arrangement position of the newly selected component supply unit as an arrangement position of the component supply unit to be newly arranged in the one job, wherein an arranging device which arranges the newly selected component supply unit in the arrangement position for the one job; and
execute the one job after switching the newly selected supply unit of the mounter.

* * * * *